United States Patent
Itou et al.

(10) Patent No.: US 6,434,070 B1
(45) Date of Patent: Aug. 13, 2002

(54) SEMICONDUCTOR INTEGRATED CIRCUIT WITH VARIABLE BIT LINE PRECHARGING VOLTAGE

(75) Inventors: Hiroshi Itou; Osamu Kitade, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/909,976

(22) Filed: Jul. 23, 2001

(30) Foreign Application Priority Data

Feb. 16, 2001 (JP) ........................................ 2001-040172

(51) Int. Cl.⁷ ............................................... G11C 7/00
(52) U.S. Cl. ..................... 365/203; 365/226; 365/201
(58) Field of Search ................................. 365/201, 203, 365/200, 225.7, 226

(56) References Cited

U.S. PATENT DOCUMENTS 5,459,684 A * 10/1995 Nakamura et al. .......... 365/201
5,523,977 A *  6/1996 Tobita et al. ................ 365/201
6,327,198 B1 * 12/2001 Kato et al. .................. 365/201

FOREIGN PATENT DOCUMENTS

JP              2-214100              8/1990

* cited by examiner

*Primary Examiner*—Trong Phan
(74) *Attorney, Agent, or Firm*—McDermott, Will & Emery

(57) ABSTRACT

The VBL variable circuit is provided with a VBL generating circuit, a test mode judging circuit, a large pump and a small pump, and makes a voltage for precharging a bit line variable. Thus, a defective bit line having little margin with respect to a bit line precharging voltage of a high level or a low level can be detected.

11 Claims, 12 Drawing Sheets

SEMICONDUCTOR INTEGRATED CIRCUIT WITH VARIABLE BIT LINE PRECHARGING VOLTAGE

BACKGROUND OF THE INVENTION

1. Field of the Invention

The present invention relates to semiconductor integrated circuits, and more particularly, to a circuit configuration capable of varying a voltage level for precharging a bit line.

2. Description of the Background Art

In a wafer testing process in course of manufacturing a semiconductor device such as a dynamic random access memory (DRAM), wafer testing is generally conducted before tuning an internal voltage, by externally applying a voltage for precharging a bit line.

In the DRAM and others, however, there are cases where a word line and a bit line have been short-circuited with each other in the wafer testing process.

An example of such a case is shown in FIG. 12, which is a circuit diagram of a portion including a memory cell MC1 in a memory cell array of the DRAM, in which a word line WL2 and a bit line BL2 are short-circuited.

Referring to FIG. 12, memory cell MC1 includes a transistor NN1 and a capacitor CC1.

To access memory cell MC1, word line WL1 is activated to an H level, while word line WL2 is maintained at a non-accessed state of an L level.

In this state, if bit line BL1 and word line WL2 are short-circuited, the voltage for precharging the bit line, which is originally set half a value of an internal power supply voltage VCCS, i.e., ½ (VCCS), would be affected by the L level of word line WL2, so that it would become a value lower than the desired voltage level.

At the time of reading out "L" data of memory cell MC1, if the precharge voltage of the bit line is made lower than the original value due to the short circuit, as shown in FIG. 13, the reading of the "L" data becomes difficult, and there is a high possibility that the read data of the "L" level from memory cell MC1 may be misread as an "H" level.

At the time of wafer testing, however, the precharge voltage of the bit line is externally supplied. Thus, even if such a short circuit takes place, the value of the precharge voltage of the bit line is stable in the normal operation, making it impossible to find the abnormality.

Therefore, defects due to such abnormality of the precharge voltage of the bit line cannot be rejected or relieved, causing degradation of the yield.

SUMMARY OF THE INVENTION

An object of the present invention is to provide a circuit that is capable of varying a bit line voltage to accelerate a defect of a bit line, so that the bit line defect due to an abnormal bit line voltage can be rejected and relieved.

The semiconductor integrated circuit according to an aspect of the present invention includes: a memory cell array region having a plurality of memory cells arranged in rows and columns, a plurality of word lines provided corresponding to the rows of the memory cells, and a plurality of bit lines provided corresponding to the columns of the memory cells; and a voltage generating circuit receiving a first power supply voltage for generating a bit line voltage for use in precharging said plurality of bit lines. The voltage generating circuit includes: a voltage transforming circuit receiving the first power supply voltage to generate a second power supply voltage having a voltage level equivalent to a reference value of the bit line voltage; and a voltage control circuit receiving the second power supply voltage for outputting the bit line voltage. The voltage control circuit includes at least one of a voltage boost circuit boosting the second power supply voltage supplied to generate the bit line voltage, and a voltage step-down circuit reducing the second power supply voltage supplied to generate the bit line voltage.

Preferably, the voltage control circuit includes both the voltage boost circuit and the voltage step-down circuit. The voltage control circuit further includes a judging circuit selectively supplying the second power supply voltage to either one of the voltage boost circuit and the voltage step-down circuit in a test mode, according to an external command.

Preferably, the voltage control circuit further includes a voltage transmitting unit, provided between the voltage transforming circuit and the plurality of bit lines and the voltage control circuit outputs the second power supply voltage by use of the voltage transmitting unit as the bit line voltage in a mode other than the test mode.

According to the semiconductor integrated circuit described above, it becomes possible to detect a defect of the bit line caused by an abnormal bit line voltage.

Preferably, the voltage control circuit includes the voltage boost circuit, the voltage step-down circuit, and a voltage transmitting unit for supplying the second power supply voltage as the bit line voltage. The voltage control circuit further includes a judging circuit for selectively supplying the second power supply voltage to one of the voltage boost circuit, the voltage step-down circuit and the voltage transmitting unit, according to a comparison between the bit line voltage and a reference voltage.

According to the semiconductor integrated circuit described above, it becomes possible to relieve the defect of the bit line due to the abnormal bit line voltage, and thus to improve the yield.

Preferably, the voltage generating circuit includes: a plurality of first resistance elements connected in series between a first power supply node supplying the first power supply voltage and a first internal node; a plurality of second resistance elements connected in series between a second power supply node supplying a third power supply voltage and the first internal node; a first switch circuit for short-circuiting at least one of the plurality of first resistance elements; according to an external command and a second switch circuit for short-circuiting at least one of the plurality of second resistance elements according to an external command.

In particular, the first and second switch circuits include a plurality of transistors connected in parallel with the first and second resistance elements, respectively. In the test mode, at least one of the plurality of transistors is turned on according to a test signal.

According to the semiconductor integrated circuit described above, it becomes possible to detect a defect of the bit line caused by an abnormal bit line voltage.

In particular, the first and second switch circuits include a plurality of fuses that can be externally burnt in a non-volatile manner, which are connected in parallel with the first and second resistance elements, respectively.

According to the semiconductor integrated circuit described above, it becomes possible to relieve the defect of the bit line due to the abnormal bit line voltage, and thus to improve the yield.

The semiconductor integrated circuit according to another aspect of the present invention includes: a memory cell array region having a plurality of memory cells arranged in rows and columns, a plurality of word lines provided corresponding to the rows of the memory cells and a plurality of bit lines provided corresponding to the columns of the memory cells; and a voltage generating circuit receiving a plurality of first power supply voltages for generating a bit line voltage for precharging the plurality of bit lines. The voltage generating circuit includes: the voltage control circuit selecting one of supplied plurality of first power supply voltage to output as an internal voltage in a test mode, according to an external command; and a voltage transforming circuit receiving the internal voltage to generate the bit line voltage.

Preferably, the voltage transforming circuit includes: a plurality of first resistance elements connected in series between a first internal node supplied with the internal voltage and a second internal node to supply the bit line voltage; a plurality of second resistance elements connected in series between a second power supply node supplying a second power supply voltage and the second internal node; a first switch circuit for short-circuiting at least one of the plurality of first resistance elements according to an external command; and a second switch circuit for short-circuiting at least one of the plurality of second resistance elements according to an external command.

In particular, the first and second switch circuits include a plurality of transistors connected in parallel with the first and second resistance elements, respectively. In the test mode, at least one of the plurality of transistors is turned on according to a test signal in each of the first and second switch circuit.

According to the semiconductor integrated circuit described above, it becomes possible to detect a defect of the bit line caused by an abnormal bit line voltage.

In particular, the first and second switch circuits include a plurality of fuses that can be externally burnt in a nonvolatile manner, which are connected in parallel with the first and second resistance elements, respectively.

According to the semiconductor integrated circuit described above, it becomes possible to relieve the defect of the bit line due to the abnormal bit line voltage, and thus to improve the yield.

The semiconductor integrated circuit according to yet another aspect of the present invention includes: a memory cell array region having a plurality of memory cells arranged in rows and columns, a plurality of word lines provided corresponding to the rows of the memory cells and a plurality of bit lines provided corresponding to the columns of the memory cells; and a voltage generating circuit receiving a first power supply voltage for generating a bit line voltage in an internal node for use in precharging the plurality of bit lines. The voltage generating circuit includes: a plurality of first resistance elements connected in series between a first power supply node supplying the first power supply voltage and a first internal node; a plurality of second resistance elements connected in series between a second power supply node supplying a second power supply voltage and the internal node; a first switch circuit for short-circuiting at least one of the plurality of first resistance elements according to external a command; and a second switch circuit for short-circuiting at least one of the plurality of second resistance elements.

Preferably, the first and second switch circuits include a plurality of transistors connected in parallel with the first and second resistance elements, respectively. In the test mode, at least one of the plurality of transistors is turned on according to a test signal.

According to the semiconductor integrated circuit described above, it becomes possible to detect a defect of the bit line caused by an abnormal bit line voltage.

Preferably, the first and second switch circuits include a plurality of fuses that can be externally burnt in a nonvolatile manner, which are connected in parallel with the first and second resistance elements, respectively.

According to the semiconductor integrated circuit described above, it becomes possible to relieve the defect of the bit line due to the abnormal bit line voltage, and thus to improve the yield.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
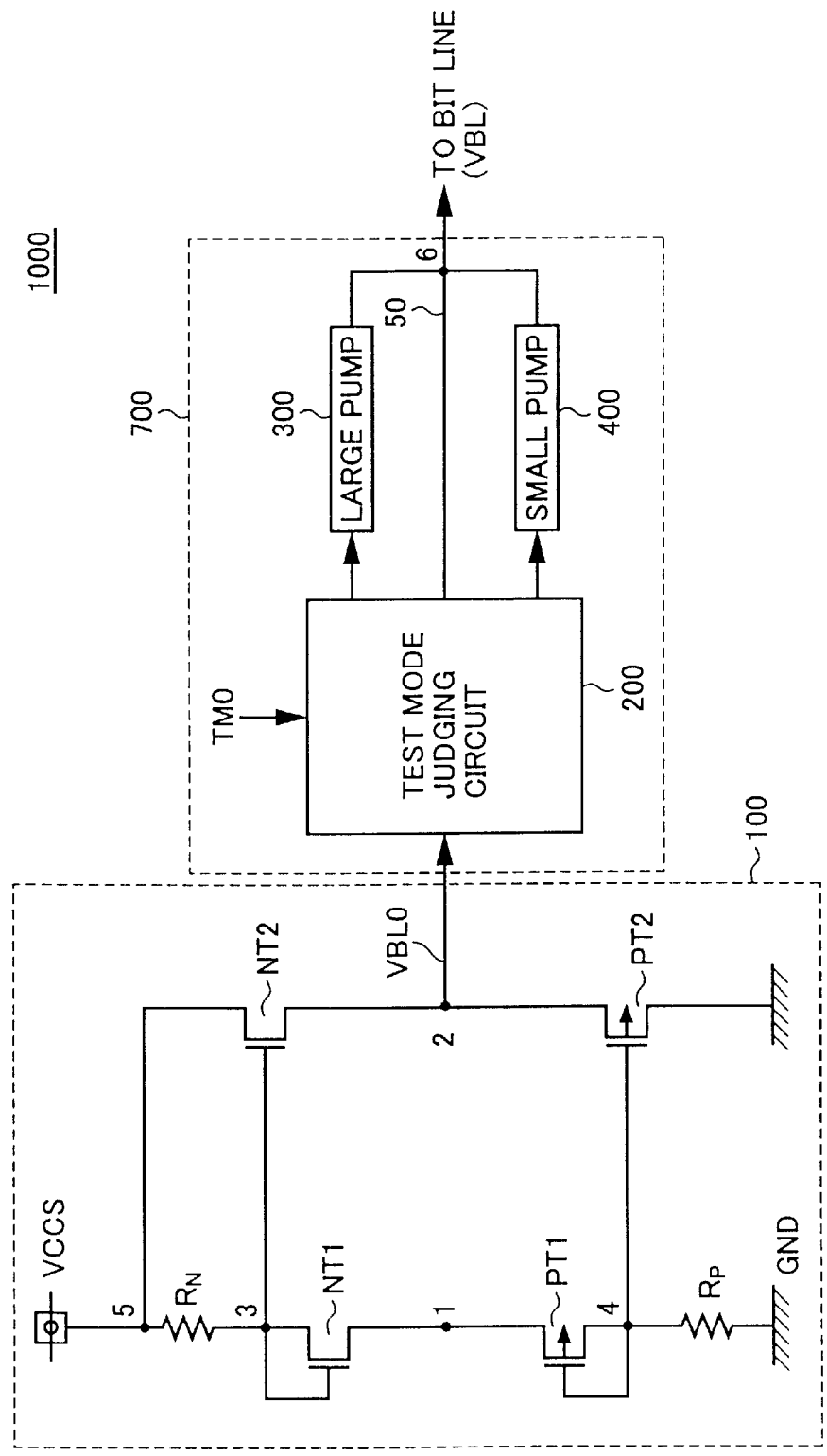
FIG. 1 shows an example of a VBL (which is an abbreviation for "Voltage for precharging Bit Line") variable circuit 1000 according to a first embodiment of the present invention.

Hereinafter, embodiments of the present invention will be described in detail with reference to the drawings, through which the same or corresponding portions are denoted by the same reference characters, and description thereof will not be repeated where appropriate.

First Embodiment

An example of VBL variable circuit 1000 according to the first embodiment is shown in FIG. 1. Referring to FIG. 1, VBL variable circuit 1000 includes: a VBL generating circuit 100, and a VBL control circuit 700. VBL control circuit 700 have: a test mode judging circuit 200 a large jump 300 and a small pump 400.

VBL generating circuit 100 receives an internal power supply voltage VCCS generated within the DRAM, and generates a voltage for use in precharging a bit line (hereinafter, also referred to as "bit line voltage VBL").

As shown in FIG. 1, VBL generating circuit 100 includes P channel MOS transistors PT1 and PT2, N channel MOS transistors NT1 and NT2, and resistance elements Rn and Rp.

Resistance elements Rn and Rp, P channel MOS transistor PT1 and N channel MOS transistor NT1 are connected in series between a node 5 that is connected to internal power supply voltage VCCS and a ground voltage GND, as shown in FIG. 1.

P channel MOS transistor PT2 and N channel MOS transistor NT2 are connected in series between the node 5 connected to internal power supply voltage VCCS and ground voltage GND.

Resistance element Rn is connected between node 5 and a node 3. N channel MOS transistor NT1 is connected between node 3 and a node 1. P channel MOS transistor PT1 is connected between node 1 and a node 4, and resistance element Rp is connected between node 4 and ground voltage GND.

N channel MOS transistor NT2 is connected between node 5 and a node 2. P channel MOS transistor PT2 is connected between node 2 and ground voltage GND.

The gate electrodes of N channel MOS transistors NT1 and NT2 are both connected to node 3.

The gate electrodes of P channel MOS transistors PT1 and PT2 are both connected to node 4.

VBL generating circuit 100 receives internal power supply voltage VCCS. It sets a resistance value of a current path from node 5 to node 1 including resistance element Rn and a resistance value of a current path from node 1 to ground voltage GND including resistance element Rp equal to each other, and outputs a reference voltage VBL0 (=½ VCCS) to node 2.

Test mode judging circuit 200 is connected between node 2 of VBL generating circuit 100 and a node 6, and outputs reference voltage VBL0 to large pump 300, small pump 400 or an interconnection 50 as a voltage transmitting unit, according to a test mode signal TM0.

Large pump 300 is a voltage boost circuit that receives reference voltage VBL0 output from test mode judging circuit 200 in the test mode, and supplies a boosted bit line voltage VBL (VBL>VBL0) to node 6.

Small pump 400 is a voltage step-down circuit that receives reference voltage VBL0 output from test mode judging circuit 200 in the test mode, and supplies a reduced bit line voltage VBL (VBL<VBL0) to node 6.

In a mode other than the test mode, reference voltage VBL0 generated by VBL generating circuit 100 is transmitted through interconnection 50 without alteration, and supplied to node 6 as bit line voltage VBL (VBL=VBL0).

VBL variable circuit 1000 thus selectively switches a pump to be used for reference voltage VBL0 generated by VBL generating circuit 100, according to test mode signal TM0, so that it can make the level of bit line voltage VBL variable.

Accordingly, in the test mode, a defective bit line having little margin with respect to a level of the bit line voltage can be detected.

For example, to detect a bit line having little margin with respect to a low bit line voltage, the small pump is made to operate by test mode signal TM0. Thus, the bit line voltage is reduced to a value lower than the normal bit line voltage, and therefore, a defective bit line having little margin against the low bit line voltage is accelerated, allowing detection thereof.

To detect a bit line having little margin with respect to a high bit line voltage, test mode signal TM0 is set to cause the large pump to operate. The bit line voltage is increased to a value greater than the normal bit line voltage. Thus, the defective bit line having little margin against the high bit line voltage is accelerated, enabling detection thereof.

In the present embodiment, only one of the large pump 300 as the boost circuit and the small pump 400 as the step-down circuit may be provided, depending on the purpose of the test. Alternatively, at least two large pumps 300 having different boosting amounts and at least two small pumps 400 having different reducing amounts may be provided in parallel.

With such a configuration, the bit line voltage can be set more meticulously at the time of testing, so that defective bit lines may be detected with high accuracy.

Second Embodiment

Figure 2:
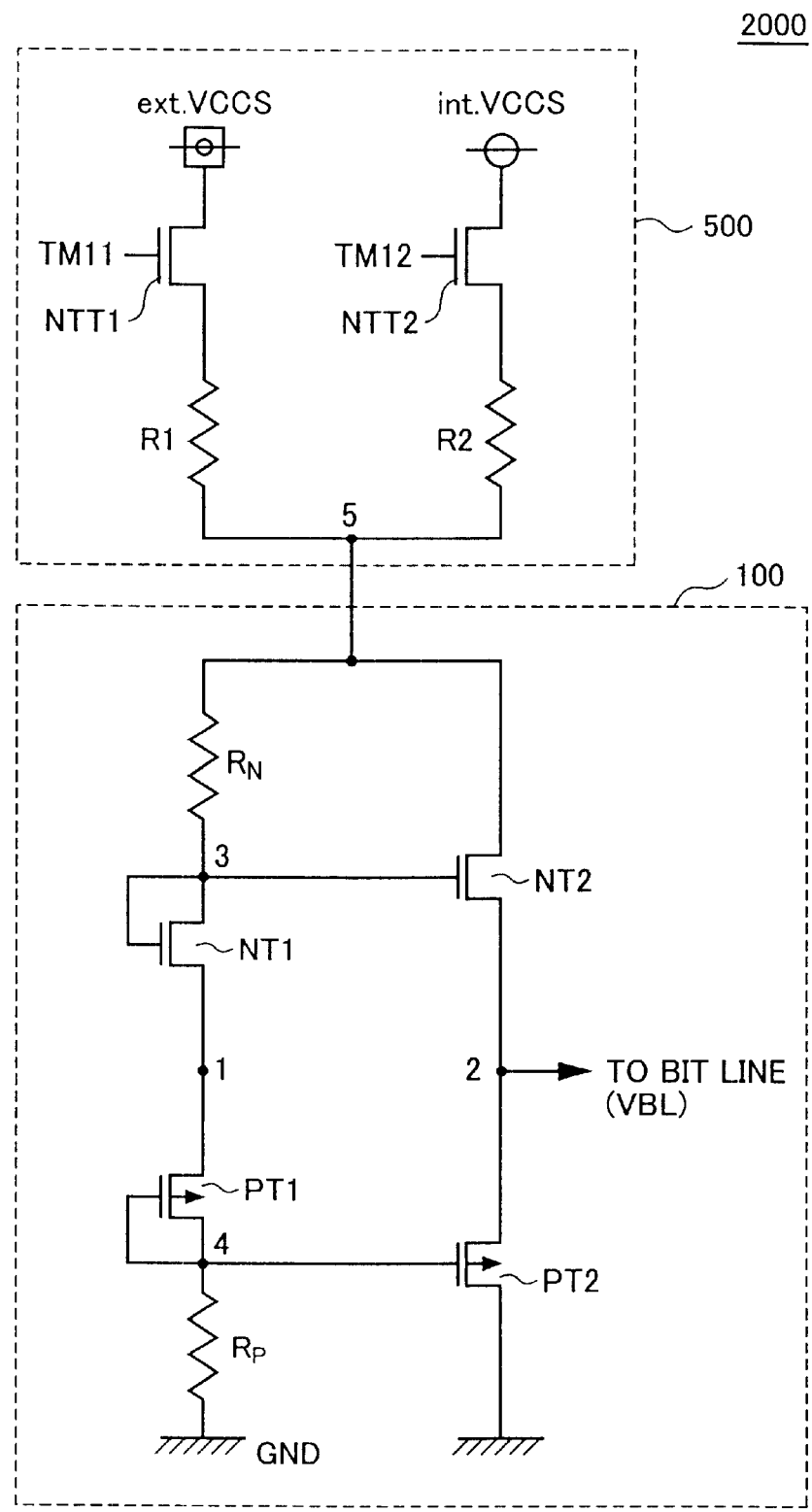
FIG. 2 shows an example of a VBL variable circuit 2000 according to a second embodiment of the present invention.

An example of VBL variable circuit 2000 according to the second embodiment is shown in FIG. 2. Referring to FIG. 2, VBL variable circuit 2000 is provided with a power supply voltage control circuit 500 and VBL generating circuit 100.

Power supply voltage control circuit 500 receives an external power supply voltage ext. VCCS and an internal power supply voltage int. VCCS (that is lower than external power supply voltage ext. VCCS), and switches a power supply voltage to be supplied to VBL generating circuit 100 using test mode signal TM11 or TM12.

Power supply voltage control circuit 500 includes N channel MOS transistors NTT1 and NTT2, and resistance elements R1 and R2.

N channel MOS transistor NTT1 and resistance element R1 are connected between external power supply voltage ext. VCCS and node 5 of VBL generating circuit 100.

N channel MOS transistor NTT2 and resistance element R2 are connected between internal power supply voltage int. VCCS and node 5 of VBL generating circuit 100.

The gate electrodes of N channel MOS transistors NTT1 and NTT2 receive test mode signals TM11 and TM12, respectively.

N channel MOS transistor NTT1 is turned on according to test mode signal TM11, and supplies external power supply voltage ext. VCCS to resistance element R1.

N channel MOS transistor NTT2 is turned on according to test mode signal TM12, and supplies internal power supply voltage int. VCCS to resistance element R2.

VBL generating circuit 100 is connected to power supply voltage control circuit 500 through node 5. VBL generating circuit 100 of the present embodiment has the internal connection relation identical to that of the first embodiment.

VBL variable circuit 2000 is able to switch a power supply voltage to be used according to the test mode signals, thereby making the level of bit line voltage variable.

Accordingly, any defective bit line having little margin against low or high bit line voltage level can be detected.

For example, to detect a bit line having little margin against a low bit line voltage, test mode signal TM12 is set to provide internal power supply voltage int. VCCS. Thus, the bit line voltage is reduced to a level lower than the normal bit line voltage. This accelerates the defective bit line having little margin against the low bit line voltage, so that the detection thereof is enabled.

To detect a bit line having little margin against a high bit line voltage, test mode signal TM11 is set to use external power supply voltage ext. VCCS. Thus, the bit line voltage is boosted to a level greater than the normal bit line voltage, so that the defective bit line having little margin against the high bit line voltage is accelerated, enabling the detection thereof.

In the configuration shown in FIG. 2, two power supply voltages, i.e., external power supply voltage ext. VCCS and internal power supply voltage int. VCCS, are selectively employed to generate bit line voltage VBL. Alternatively, an arbitrary number of power supply voltages may be employed for generation of bit line voltage VBL.

Third Embodiment

Figure 3:
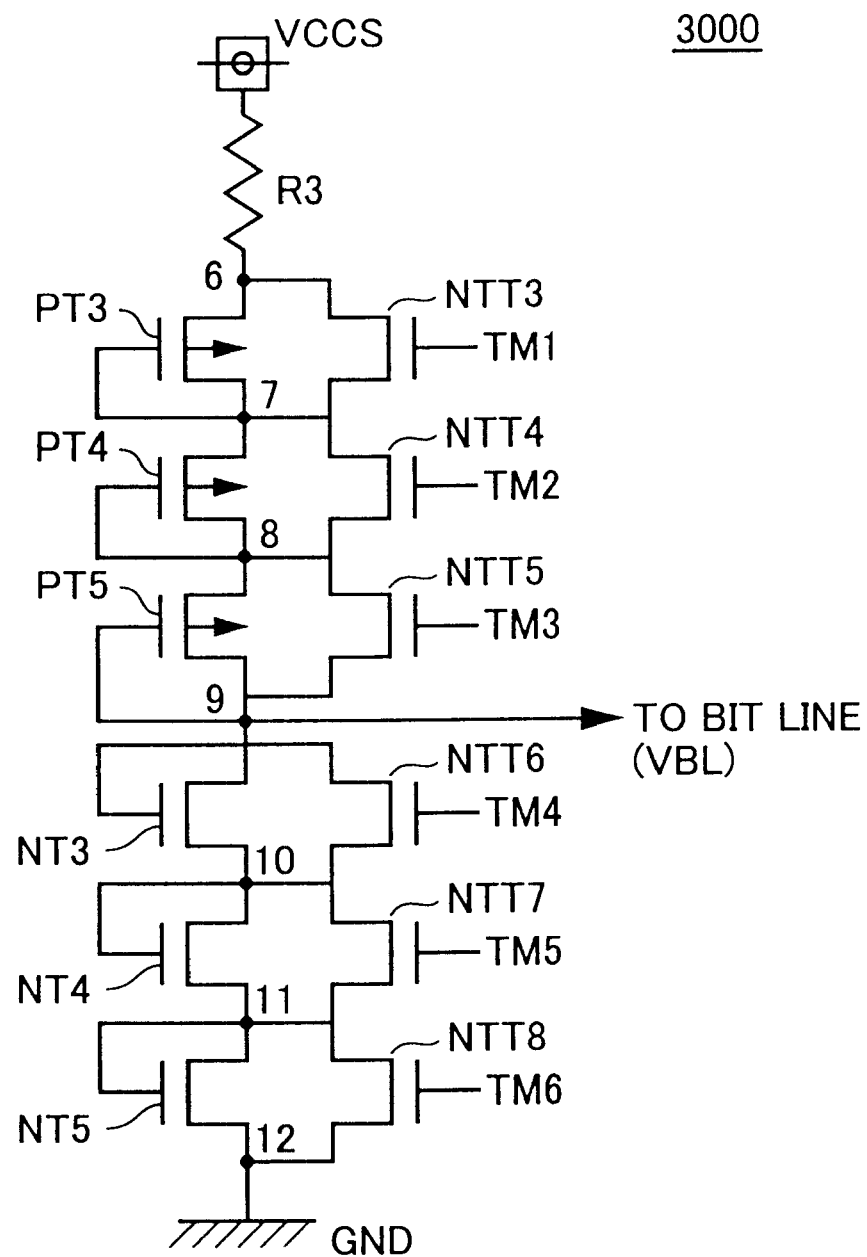
FIG. 3 shows an example of a VBL variable circuit 3000 according to a third embodiment of the present invention.

An example of VBL variable circuit 3000 according to the third embodiment is shown in FIG. 3.

In VBL variable circuit 3000, a resistance element R3, P channel MOS transistors PT3–PT5 and N channel MOS transistors NT3–NT5 are connected in series between power supply voltage VCCS and a node 12 that is supplied with ground voltage GND.

Resistance element R3 is connected between power supply voltage VCCS and a node 6.

N channel MOS transistors NTT3–NTT8 are connected in series between nodes 6 and 12.

P channel MOS transistor PT3 and N channel MOS transistor NTT3 are connected in parallel between nodes 6 and 7.

The gate electrode of P channel MOS transistor PT3 is connected to node 7. The gate electrode of N channel MOS transistor NTT3 receives a test mode signal TM1.

P channel MOS transistor PT4 and N channel MOS transistor NTT4 are connected in parallel between nodes 7 and 8.

The gate electrode of P channel MOS transistor PT4 is connected to node 8. The gate electrode of N channel MOS transistor NTT4 receives a test mode signal TM2.

P channel MOS transistor PT5 and N channel MOS transistor NTT5 are connected in parallel between nodes 8 and 9.

The gage electrode of P channel MOS transistor PT5 is connected to node 9. The gate electrode of N channel MOS transistor NTT5 receives a test mode signal TM3.

N channel MOS transistors NT3 and NTT6 are connected in parallel between nodes 9 and 10.

The gate electrode of N channel MOS transistor NT3 is connected to node 9. The gate electrode of N channel MOS transistor NTT6 receives a test mode signal TM4.

N channel MOS transistors NT4 and NTT7 are connected in parallel between nodes 10 and 11.

The gate electrode of N channel MOS transistor NT4 is connected to node 10. The gate electrode of N channel MOS transistor NTT7 receives a test mode signal TM5.

N channel MOS transistors NT5 and NTT8 are connected in parallel between node 11 and the node 12 that is connected to ground voltage GND.

The gate electrode of N channel MOS transistor NT5 is connected to node 11. The gate electrode of N channel MOS transistor NTT8 receives a test mode signal TM6.

P channel MOS transistors PT3–PT5 and N channel MOS transistors NT3–NT5 each function as a resistance element.

VBL variable circuit 3000 outputs bit line voltage VBL from node 9.

The bit line voltage VBL being output to node 9 is determined according to a ratio between a resistance value Ru of a current path formed between power supply voltage VCCS and node 9 and a resistance value Rd of a current path formed between ground voltage VSS and node 9.

VBL variable circuit 3000 uses test mode signals TM1–TM6 to short circuit the corresponding N channel MOS transistors NT3–NT5 and P channel MOS transistors PT3–PT5, so as to adjust the resistance value Ru of the current path from power supply voltage VCCS to node 9 and the resistance value Rd of the current path from ground voltage VSS to node 9. Thus, the bit line voltage VBL is made variable.

In other words, by switching test mode signals TM1–TM6, VBL variable circuit 3000 makes the bit line voltage level variable, and thus detects any defective bit line having little margin against the relevant bit line voltage level.

For example, to detect a bit line having little margin against a low bit line voltage, at least one of test mode signals TM1–TM3 is input to the corresponding gate electrodes of N channel MOS transistors NTT3–NTT5; so that at least one of those transistors NTT3–NTT5 is turned on.

This reduces resistance value Ru, and the bit line voltage is reduced to a value lower than the normal bit line voltage. The defective bit line having little margin against the low bit line voltage is thus accelerated, thereby enabling detection thereof.

To detect a bit line having little margin against a high bit line voltage, at least one of test mode signals TM4–TM6 is input to the corresponding gate electrodes of N channel MOS transistors NTT6–NTT8, so that at least one of these transistors NTT6–NTT8 is turned on.

Resistance value Rd is thus decreased, and the bit line voltage is boosted to a value greater than the normal bit line voltage. Accordingly, any defective bit line having little margin against the high bit line voltage is accelerated, thereby enabling detection thereof.

Figure 4:
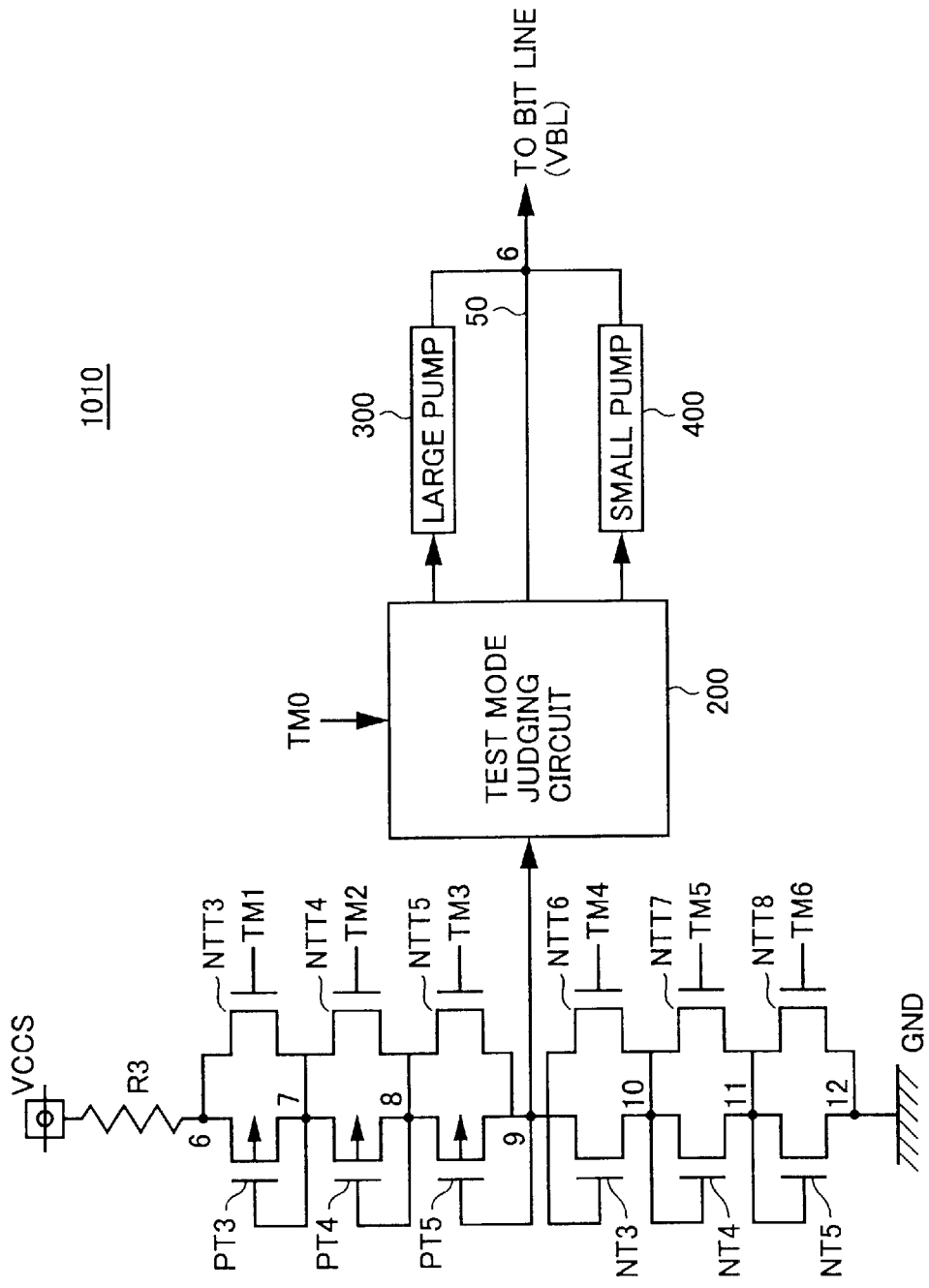
FIG. 4 shows an example of a VBL variable circuit 1010 according to the first embodiment.
Figure 5:
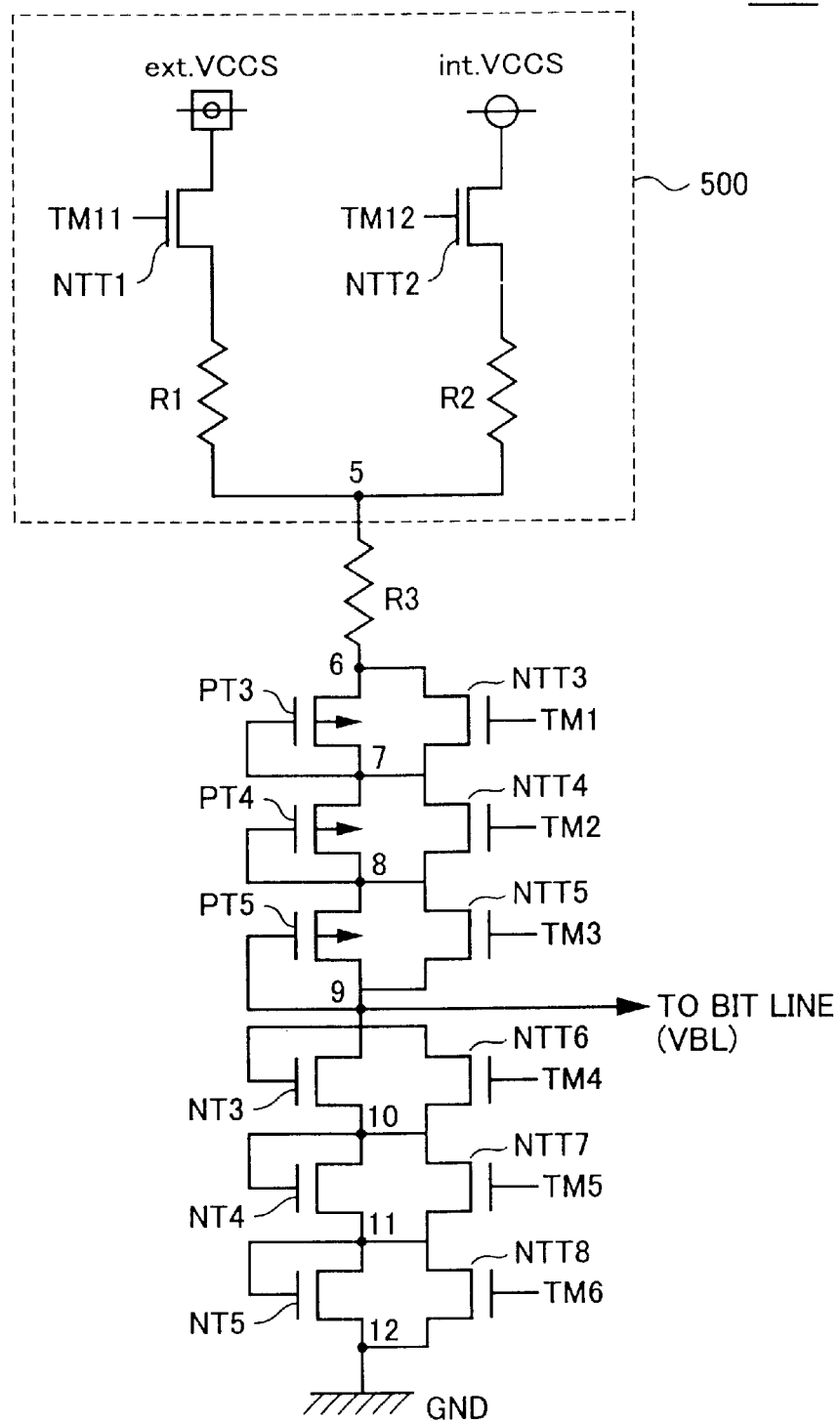
FIG. 5 shows an example of a VBL variable circuit 2010 according to the second embodiment.

VBL generating circuits 100 in the first and second embodiments shown in FIGS. 1 and 2 may be replaced with VBL variable circuit 3000 of the third embodiment. FIGS. 4 and 5 illustrate VBL variable circuits 1010 and 2010 of the first and second embodiments, respectively, in each of which VBL generating circuit 100 has been replaced with VBL variable circuit 3000.

Fourth Embodiment

Figure 6:
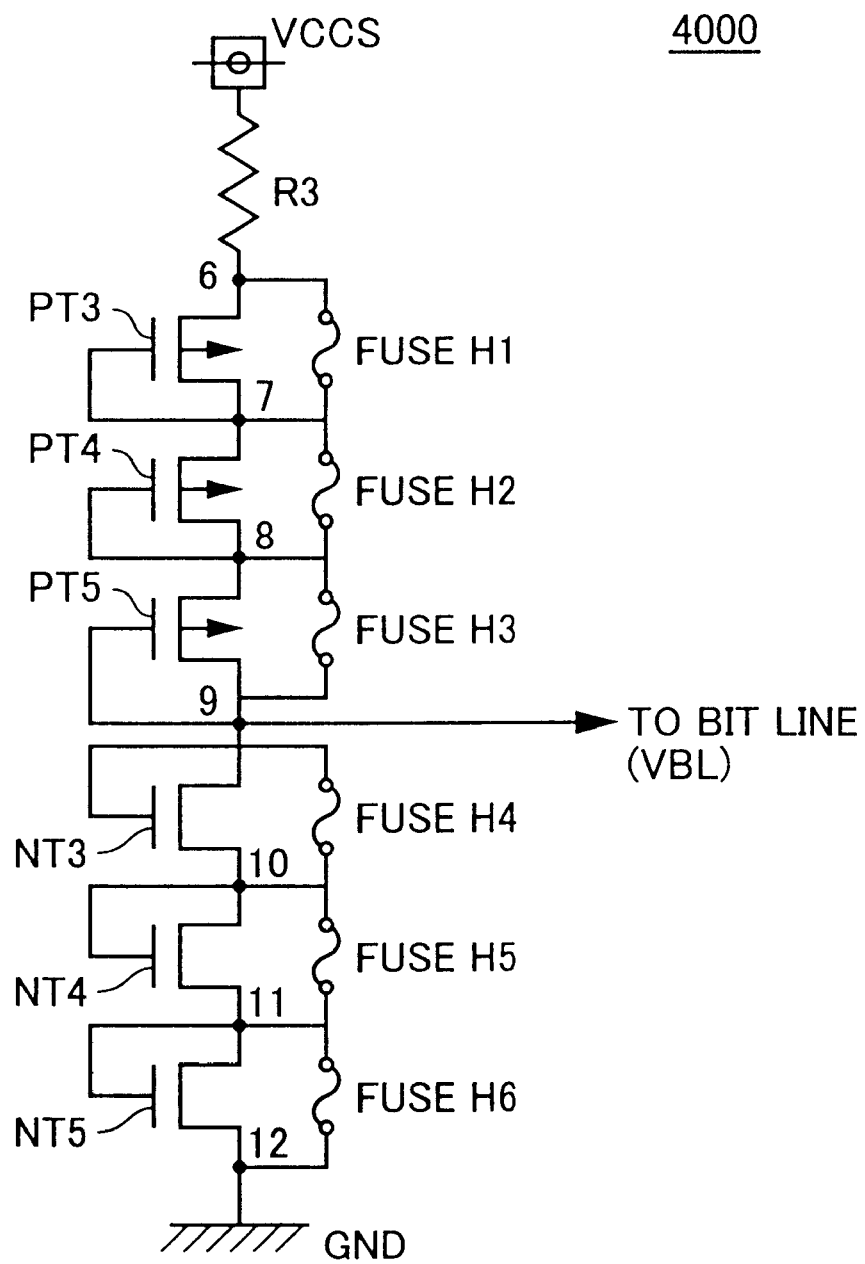
FIG. 6 shows an example of a VBL variable circuit 4000 according to a fourth embodiment of the present invention.

An example of VBL variable circuit 4000 according to the fourth embodiment is shown in FIG. 6.

Referring to FIG. 6, resistance element R3, P channel MOS transistors PT3–PT5 and N channel MOS transistors NT3–NT5 are connected in series between power supply voltage VCCS and node 12 that is supplied with ground voltage GND.

Resistance element R3 is connected between power supply voltage VCCS and node 6.

P channel MOS transistor PT3 and a fuse H1 are connected in parallel between nodes 6 and 7.

The gate electrode of P channel MOS transistor PT3 is connected to node 7.

P channel MOS transistor PT4 and a fuse H2 are connected in parallel between nodes 7 and 8.

The gate electrode of P channel MOS transistor PT4 is connected to node 8.

P channel MOS transistor PT5 and a fuse H3 are connected in parallel between nodes 8 and 9.

The gate electrode of P channel MOS transistor PT5 is connected to node 9.

N channel MOS transistor NT3 and a fuse H4 are connected in parallel between nodes 9 and 10.

The gate electrode of N channel MOS transistor NT3 is connected to node 9.

N channel MOS transistor NT4 and a fuse H5 are connected in parallel between nodes 10 and 11.

The gate electrode of N channel MOS transistor NT4 is connected to node 10.

N channel MOS transistor NT5 and a fuse H6 are connected in parallel between node 11 and the node 12 that is connected to ground voltage GND.

The gate electrode of N channel MOS transistor NT5 is connected to node 11.

VBL variable circuit 4000 outputs bit line voltage VBL from node 9.

The bit line voltage VBL being output to node 9 is determined according to a ratio between a resistance value Ru of a current path formed between power supply voltage VCCS and node 9 and a resistance value Rd of a current path formed between ground voltage VSS and node 9.

VBL variable circuit 4000 is able to adjust the resistance value Ru of the current path from power supply voltage VCCS to node 9 and the resistance value Rd of the current path from ground voltage VSS to node 9 by burning fuses H1–H6, so that the bit line voltage VBL is made variable.

Conventionally, a voltage generated by VBL generating circuit has been employed without alternation as bit line voltage VBL. Therefore, when the value of bit line voltage VBL considerably deviates from an expected value, any bit line having little margin would be unable to operate normally, resulting in a defect.

In VBL variable circuit 4000 of the fourth embodiment, fuses H1–H6 are burnt to correct bit line voltage VBL to a proper value. Accordingly, any defect caused by abnormal bit line voltage VBL can be prevented, which improves the yield.

Figure 7:
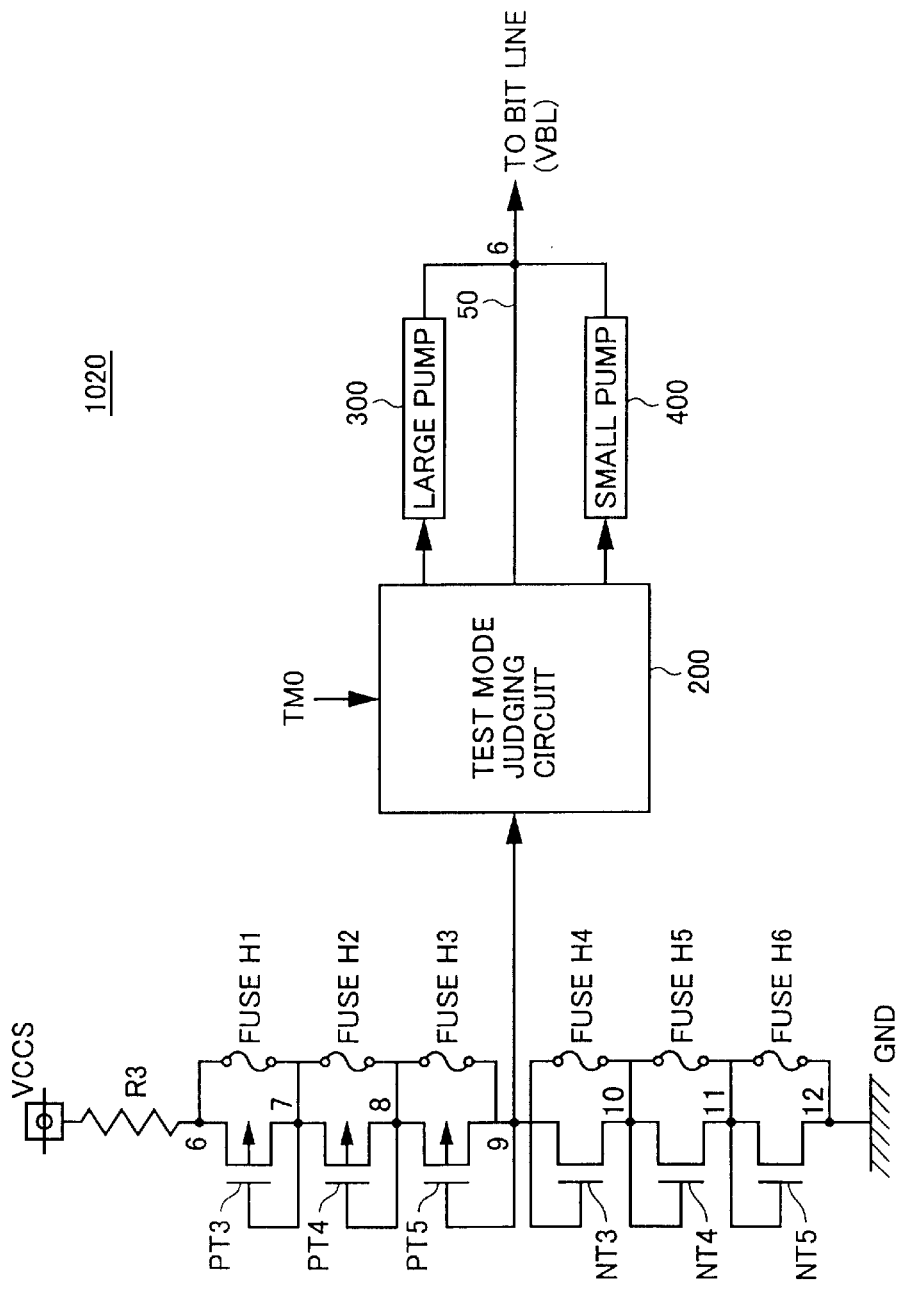
FIG. 7 shows an example of a VBL variable circuit 1020 according to the first embodiment.
Figure 8:
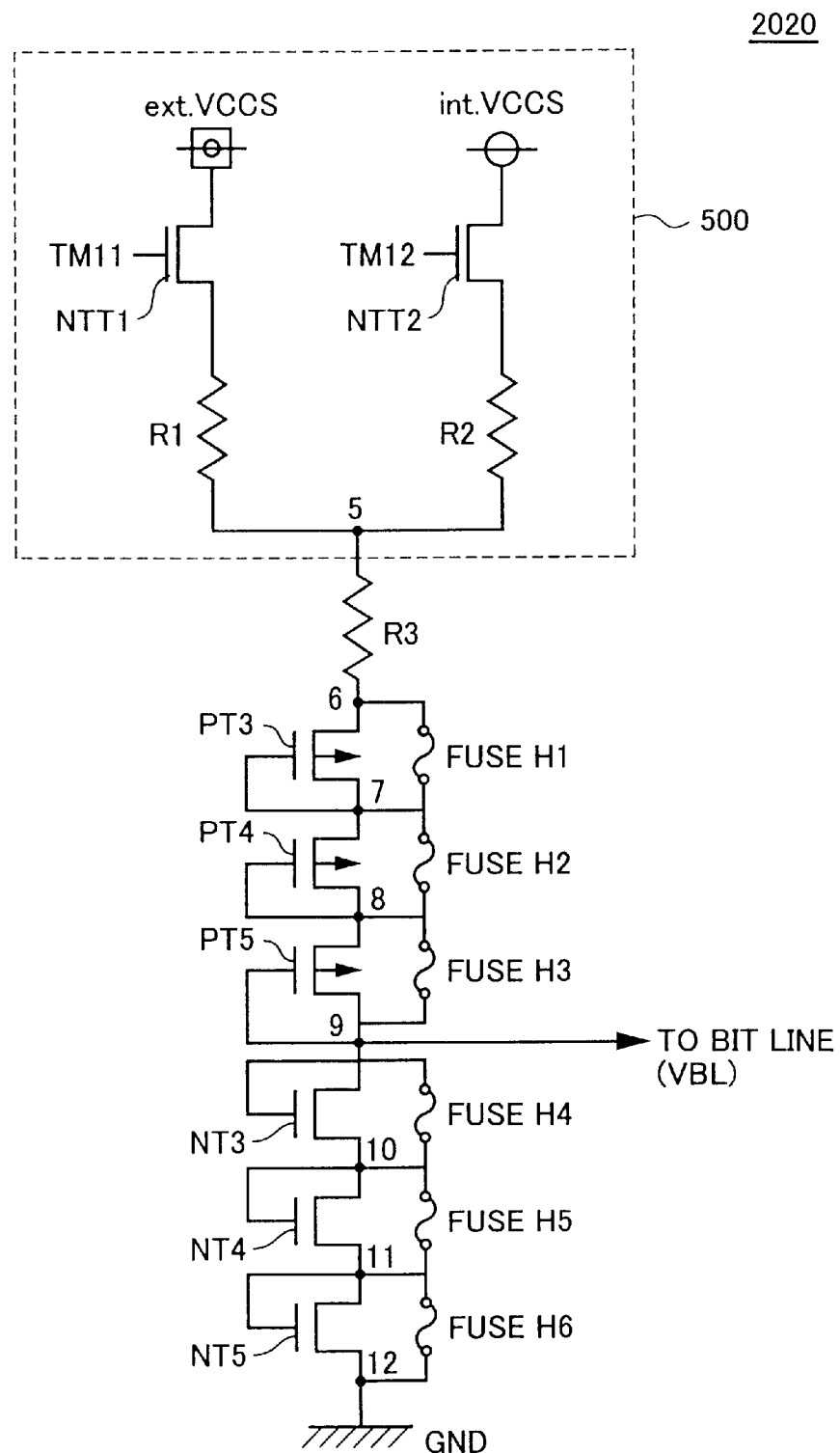
FIG. 8 shows an example of a VBL variable circuit 2020 according to the second embodiment.

Further, VBL generating circuits 100 in the first and second embodiments shown in FIGS. 1 and 2 may be replaced with VBL variable circuit 4000 of the fourth embodiment. FIGS. 7 and 8 illustrate VBL variable circuits 1020 and 2020 of the first and second embodiments, respectively, in each of which VBL generating circuit 100 has been replaced with VBL variable circuit 4000.

Fifth Embodiment

Figure 9:
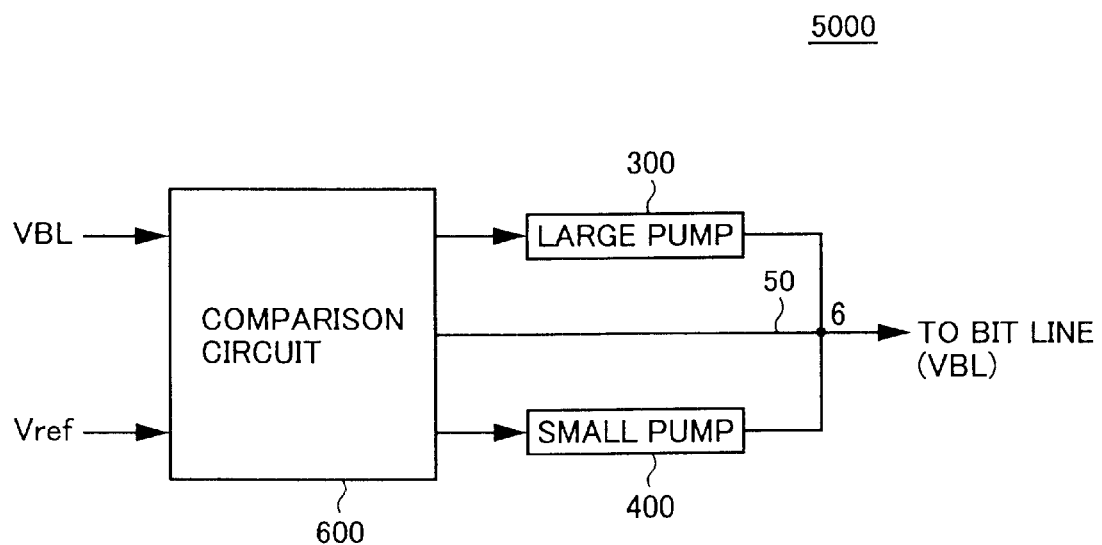
FIG. 9 shows an example of a VBL variable circuit 5000 according to a fifth embodiment of the present invention.

An example of VBL variable circuit 5000 according to the fifth embodiment is shown in FIG. 9. Referring to FIG. 9, VBL variable circuit 5000 is provided with a comparison circuit 600, large pump 300 and small pump 400.

Comparison circuit 600 is connected between node 2 of VBL generating circuit 100 as in the first embodiment and node 6. It compares the bit line voltage VBL as an input signal and a reference voltage Vref (here, Vref=½ (VCCS)) and, according to the result of the comparison, outputs bit line voltage VBL0 to one of large pump 300, small pump 400 and interconnection 50 being a voltage transmitting unit.

Specifically, when bit line voltage VBL0>reference voltage Vref, comparison circuit 600 outputs bit line voltage VBL0 to small pump 400. When bit line voltage VBL0<reference voltage Vref, it outputs bit line voltage VBL0 to large pump 300.

If bit line voltage VBL0=reference voltage Vref, bit line voltage VBL0 is output without alternation to interconnection 50 as the voltage transmitting unit, and supplied to node 6 as the bit line voltage.

Large pump 300 is a voltage boost circuit that receives bit line voltage VBL0 output from comparison circuit 600 and supplies a boosted bit line voltage VBL to node 6.

Small pump 400 is a voltage step-down circuit that receives bit line voltage VBL0 output from comparison circuit 600 and supplies a reduced bit line voltage VBL to node 6.

VBL variable circuit 5000 makes the bit line voltage level variable by switching the pump to be used. It can relieve a defective bit line with little margin against a bit line voltage level largely deviating from an expected level.

For example, if the level of bit line voltage VBL0 is high compared to reference voltage Vref, bit line voltage VBL0 is output to small pump 400 so as to relieve any bit line having little margin against such high bit line voltage VBL0.

Thus, the bit line voltage is reduced to a level lower than the normal bit line voltage, so that the bit line having little margin against the high bit line voltage can be relieved.

If the level of bit line voltage VBL0 is low compared to reference voltage Vref, the bit line voltage is output to large pump 300 to relieve any bit line having little margin against the low bit line voltage.

Accordingly, the bit line voltage is boosted to a level greater than the normal bit line voltage, so that any bit line having little margin against the low bit line voltage can be relieved.

In the present embodiment, only one of the large pump 300 as a boost circuit and the small pump 400 as a step-down circuit may be provided according to the purpose of the test. Alternatively, at least two large pumps 300 different in boosting amounts and at least two small pumps 400 different in reducing amounts may be provided in parallel.

With such a configuration, the bit line voltage at the time of testing can be set more meticulously, so that high-precision detection of defective bit lines is enabled.

VBL generating circuit 100 used in the fifth embodiment may be replaced with VBL variable circuit 3000 or 4000 shown in FIG. 3 or 6.

Figure 10:
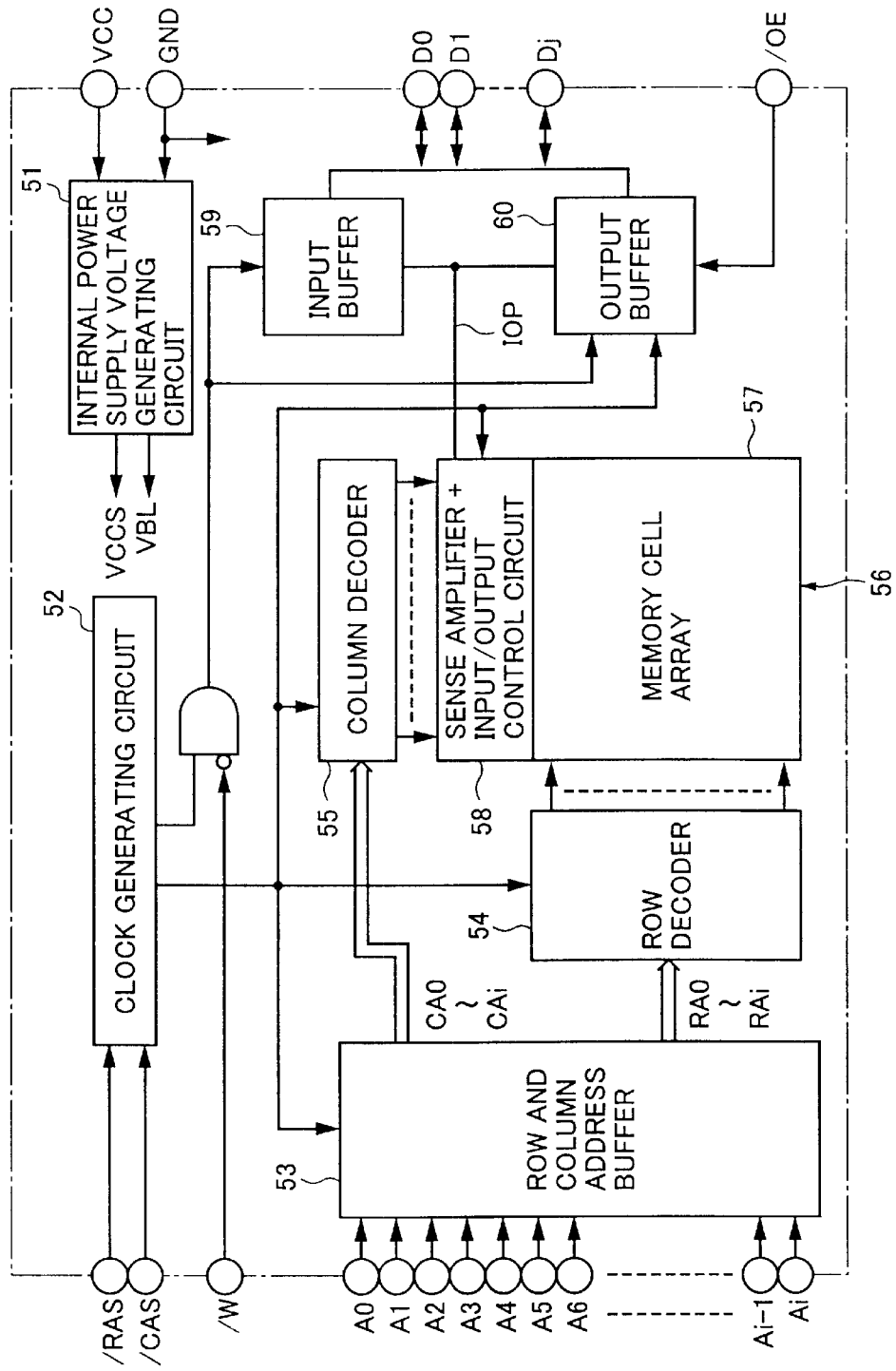
FIG. 10 shows an entire configuration of a DRAM.

FIG. 10 is a block diagram showing a configuration of the DRAM according to an embodiment of the present invention. Referring to FIG. 10, the DRAM includes: an internal power supply voltage generating circuit 51; a clock generating circuit 52; a row and column address buffer 53; a row decoder 54; a column decoder 55; a memory mat 56; an input buffer 59; and an output buffer 60. The memory mat 56 includes a memory cell array 57 and a sense amplifier+input/output control circuit 58.

Internal power supply voltage generating circuit 51 receives externally supplied power supply voltage VCC and ground voltage GND, and generates internal power supply voltages VCCS and VBL. Clock generating circuit 52 selects a prescribed operating mode based on externally supplied signals /RAS and /CAS, and controls the entire DRAM.

Row and column address buffer 53 generates row address signals RA0–RAi (i is an integer of at least 0) and column address signals CA0–CAi based on externally supplied address signals A0–Ai, and provides the generated signals RA0–RAi and CA0–CAi to row decoder 54 and column decoder 55, respectively.

Memory cell array 57 includes a plurality of memory cells, each storing data of one bit, arranged in rows and columns. Each memory cell is placed at a prescribed address that is determined by the row and column addresses.

Row decoder 54 responds to row address signals RA0–RAi supplied from row and column address buffer 53, and designates a row address of memory cell array 57. Column decoder 55 responds to column address signals CA0–CAi supplied from row and column address buffer 53, and designates a column address of memory cell array 57. Sense amplifier+input/output control circuit 58 connects the memory cell at the address designated by row decoder 54 and column decoder 55 to an end of a data input/output line pair IOP. The other end of data input/output line pair IOP is connected to both input buffer 59 and output buffer 60.

Input buffer 59, in a write mode, responds to an externally supplied signal /W and supplies externally input data Dj (j is a natural number) via data input/output line pair IOP to a selected memory cell. Output buffer 60, in a reading mode, responds to an externally input signal /OE and externally outputs read data from a selected memory cell.

Figure 11:
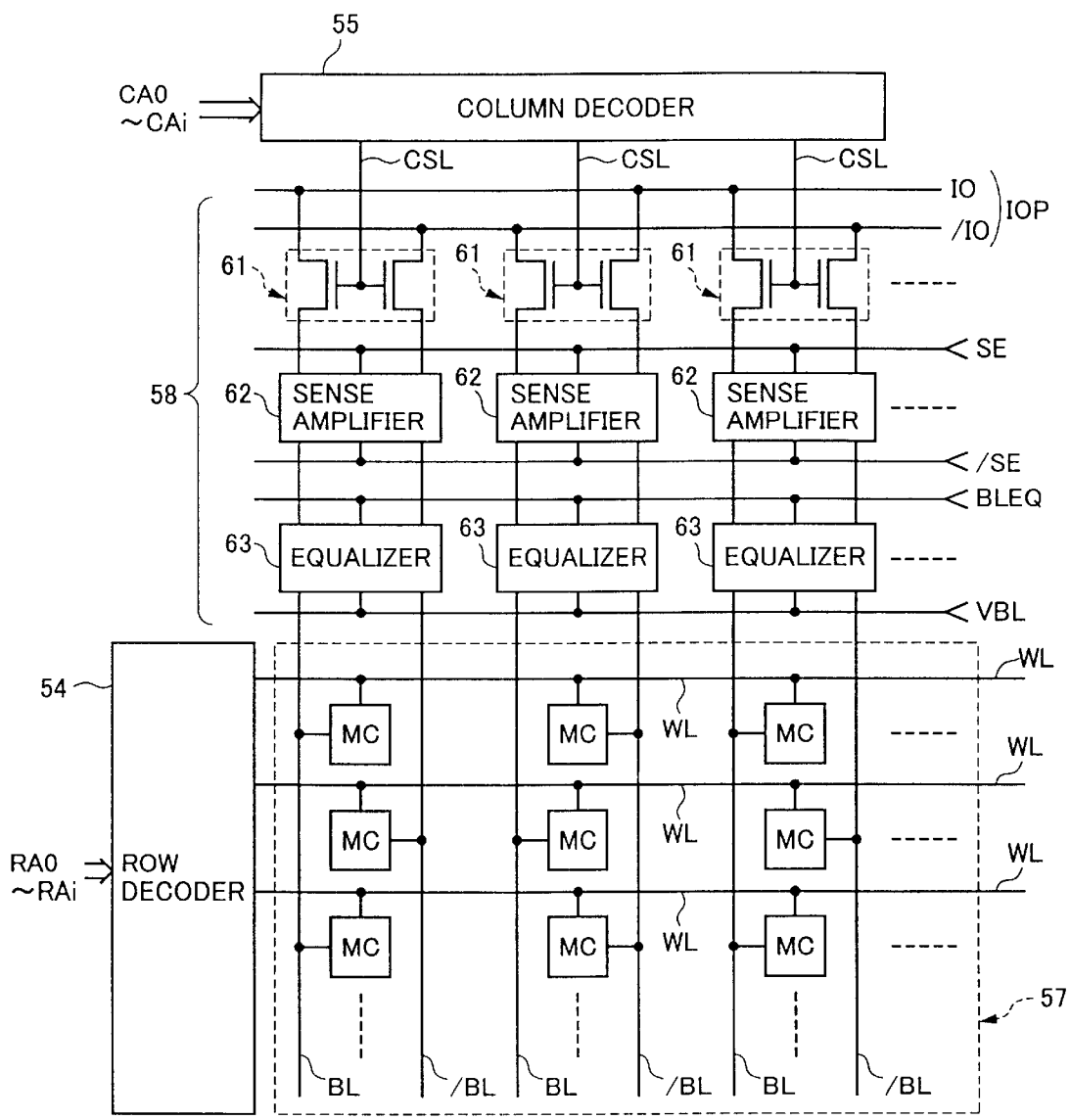
FIG. 11 is a circuit block diagram showing a configuration of a memory mat 56 of the DRAM.
Figure 12:
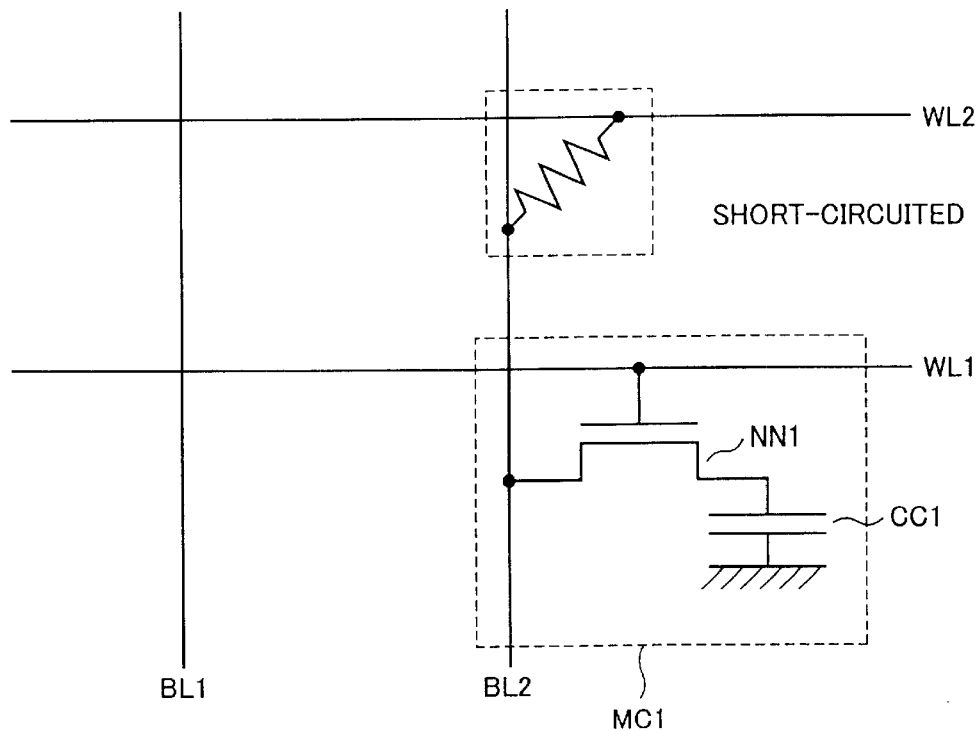
FIG. 12 is a circuit diagram showing a memory cell MC1, and a word line and a bit line being short-circuited with each other.
Figure 13:
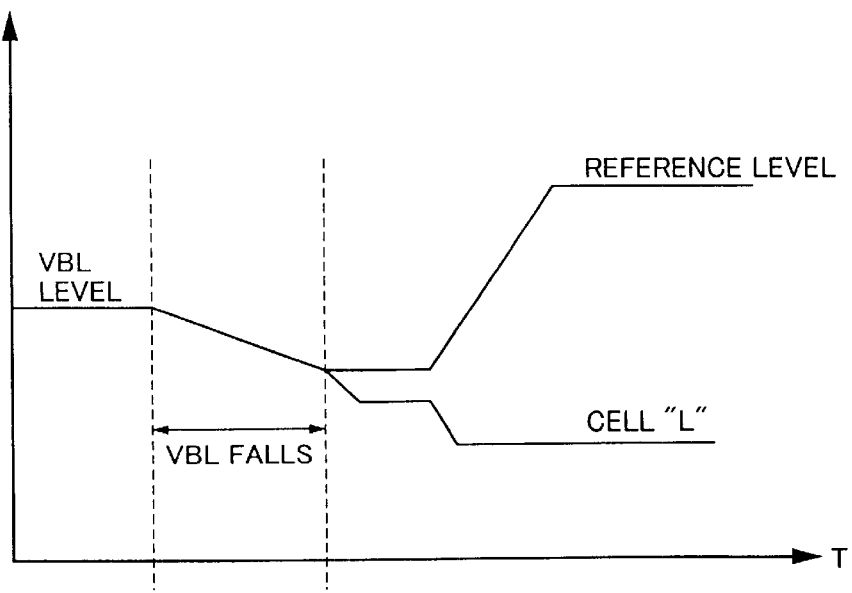
FIG. 13 shows signal waveforms when reading out "L" data of memory cell MC1 when the bit line and the word line are short-circuited.

FIG. 11 is a circuit block diagram showing a configuration of memory mat 56 of the DRAM shown in FIG. 10. Referring to FIG. 11, memory cell array 57 includes a plurality of memory cells MC arranged in rows and columns, word lines WL provided for the respective rows, and bit line pairs BL, /BL provided for the respective columns. Memory cell MC is of a well-known type including an accessing N channel MOS transistor and an information storing capacitor. Word line WL transmits an output of row decoder 54 to activate memory cells MC in a selected row. Bit line pair BL, /BL performs input/output of a data signal with a selected memory cell MC.

Sense amplifier+input/output control circuit 58 includes a data input/output line pair IO, /IO (IOP), and also includes column select gates 61, sense amplifiers 62 and equalizers 63 that are provided corresponding to the respective columns. Column select gate 61 includes a pair of N channel MOS transistors connected between bit line pair BL, /BL and data input/output line pair IO, /IO. The gates of the pair of N channel MOS transistors in each column select gate 61 are connected via a column select line CSL to column decoder 55. When column select line CSL is raised to a selected level of an "H" level in column decoder 55, the relevant pair of N channel MOS transistors is rendered conductive, and the relevant bit line pair BL, /BL and data input/output line pair IO, /IO are coupled to each other.

Sense amplifier 62 amplifies a minute potential difference between bit line pair BL, /BL to internal power supply voltage VCCS (<VCC) in response to sense amplifier activating signals SE and /SE having attained an "H" level and an "L" level, respectively. Equalizer 63, in response to a bit line equalizing signal BLEQ having attained an activated level of an "H" level, equalizes the potentials of bit line pair BL, /BL to the bit line voltage (=VCCS/2).

Accordingly, in the DRAM, different internal power supply voltages VCCS, VBL are generated based on external power supply voltage VCC.

VBL variable circuits 1000, 2000, 3000, 4000 and 5000 according to the first through fifth embodiments of the present invention are applicable to internal power supply voltage generating circuit 51 in FIG. 10, to generate a voltage for use in precharging a bit line as described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit, comprising:
   a memory cell array region including a plurality of memory cells arranged in rows and columns, a plurality of word lines provided corresponding to the respective rows of said memory cells, and a plurality of bit lines provided corresponding to the respective columns of said memory cells; and
   a voltage generating circuit receiving a first power supply voltage for generating a bit line voltage for use in precharging said plurality of bit lines,
   said voltage generating circuit including
   a voltage transforming circuit receiving said first power supply voltage for generating a second power supply voltage having a voltage level equivalent to a reference value of said bit line voltage, and
   a voltage control circuit receiving said second power supply voltage for outputting said bit line voltage,
   said voltage control circuit including at least one of
   a voltage boost circuit boosting said second power supply voltage for generating said bit line voltage and a voltage step-down circuit reducing said second power supply voltage for generating said bit line voltage.

2. The semiconductor integrated circuit according to claim 1, wherein said voltage control circuit includes both said voltage boost circuit and said voltage step-down circuit, and
   said voltage control circuit further includes a judging circuit selectively supplying said second power supply voltage to one of said voltage boost circuit and said voltage step-down circuit according to an external command in a test mode.

3. The semiconductor integrated circuit according to claim 1, wherein said voltage control circuit further includes a voltage transmitting unit provided between said voltage transforming circuit and said plurality of bit lines, and
   said voltage control circuit outputs said second power supply voltage by use of said voltage transmitting unit as said bit line voltage in a mode other than the test mode.

4. The semiconductor integrated circuit according to claim 1, wherein said voltage control circuit includes said voltage boost circuit, said voltage step-down circuit and a voltage transmitting unit for supplying said second power supply voltage as said bit line voltage, and
   said voltage control circuit further includes a judging circuit for selectively supplying said second power supply voltage to one of said voltage boost circuit, said voltage step-down circuit and said voltage transmitting unit, based on comparison between said bit line voltage and a reference voltage.

5. The semiconductor integrated circuit according to claim 1, wherein said voltage transforming circuit includes
   a plurality of first resistance elements coupled in series between a first power supply node supplying said first power supply voltage and a first internal node,
   a plurality of second resistance elements coupled in series between a second power supply node supplying a third power supply voltage and said first internal node,
   a first switch circuit for short-circuiting at least one of said plurality of first resistance elements according to a first external command, and
   a second switch circuit for short-circuiting at least one of said plurality of second resistance elements according to a second external command.

6. The semiconductor integrated circuit according to claim 5, wherein said first and second switch circuits include a plurality of transistors connected in parallel with said first and second resistance elements, respectively, and at least one of said plurality of transistors is turned on according to a test signal in a test mode.

7. The semiconductor integrated circuit according to claim 5, wherein said first and second switch circuits include a plurality of fuses externally burnable in a non-volatile manner, connected in parallel with said first and second resistance elements, respectively.

8. A semiconductor integrated circuit, comprising:

a memory cell array region including a plurality of memory cells arranged in rows and columns, a plurality of word lines provided corresponding to the rows of said memory cells and a plurality of bit lines provided corresponding to the columns of said memory cells; and a voltage generating circuit receiving a plurality of first power supply voltages for generating a bit line voltage for precharging said plurality of bit lines, said voltage generating circuit including a voltage control circuit selecting one of supplied said plurality of first power supply voltages according to an external command to output as an internal voltage in a test mode, and a voltage transforming circuit receiving said internal voltage to generate said bit line voltage.

9. The semiconductor integrated circuit according to claim 8, wherein said voltage transforming circuit includes a plurality of first resistance elements coupled in series between a first internal node supplied with said internal voltage and a second internal node to supply said bit line voltage, a plurality of second resistance elements coupled in series between a second power supply node supplying a second power supply voltage and said second internal node, a first switch circuit for short-circuiting at least one of said plurality of first resistance elements according to a first external command, and a second switch circuit for short-circuiting at least one of said plurality of second resistance elements according to a second external command.

10. The semiconductor integrated circuit according to claim 9, wherein said first and second switch circuits include a plurality of transistors connected in parallel with said first and second resistance elements, respectively, and at least one of said plurality of transistors is turned on according to a test signal in each of said first and second switch circuit in a test mode.

11. The semiconductor integrated circuit according to claim 9, wherein said first and second switch circuits include a plurality of fuses externally burnable in a non-volatile manner that are connected in parallel with said first and second resistance elements, respectively.

* * * * *